US008581101B2

(12) United States Patent
Brosseau et al.

(10) Patent No.: US 8,581,101 B2
(45) Date of Patent: Nov. 12, 2013

(54) SHIELDING DEVICE FOR WIRES LOCATED IN LIGHT-EMITTING APPARATUSES

(76) Inventors: Marc Brosseau, Boisbriand (CA); Maxime Pouliot, Ste-Marthe-sur-le-Lac (CA); Claude Rivet, Ste-Marthe-sur-le-Lac (CA)

( * ) Notice: Subject to any disclaimer, the term of this patent is extended or adjusted under 35 U.S.C. 154(b) by 317 days.

(21) Appl. No.: 12/764,648

(22) Filed: Apr. 21, 2010

(65) Prior Publication Data

US 2011/0174513 A1 Jul. 21, 2011

(30) Foreign Application Priority Data

Jan. 21, 2010 (CA) ..................................... 2690763

(51) Int. Cl.

| | |
|---|---|
| ***H01B 7/00*** | (2006.01) |
| *H02G 3/04* | (2006.01) |
| *H01B 7/42* | (2006.01) |
| *H01B 9/06* | (2006.01) |
| *H02G 3/03* | (2006.01) |
| *H05K 7/20* | (2006.01) |
| *H02G 15/20* | (2006.01) |
| *H01B 7/18* | (2006.01) |

(52) U.S. Cl.
USPC ....... 174/72 A; 174/16.1; 174/15.7; 174/15.6; 174/102 R; 174/121 A

(58) Field of Classification Search
USPC ............ 174/8, 11 R, 11 BH, 15.1, 15.2, 15.3, 174/15.4, 15.5, 15.6, 15.7, 16.1, 16.3, 17 R, 174/17.05, 17.06, 17 LF, 20, 21 R, 22 R, 174/23 R, 31.5, 559, 68.3, 102 R, 103, 174/121 A; 432/143, 178, 223, 59
See application file for complete search history.

(56) References Cited

U.S. PATENT DOCUMENTS

| | | | | |
|---|---|---|---|---|
| 3,485,930 | A * | 12/1969 | Priaroggia | 174/15.6 |
| 4,934,929 | A * | 6/1990 | Kelly | 432/59 |
| 5,004,865 | A * | 4/1991 | Krupnicki | 174/15.7 |
| 5,454,716 | A * | 10/1995 | Banerjee et al. | 433/20 |
| 5,853,801 | A * | 12/1998 | Suga et al. | 427/164 |
| 7,265,297 | B2 * | 9/2007 | Ashibe et al. | 174/125.1 |
| 8,109,010 | B2 * | 2/2012 | Hamamoto | 34/423 |

* cited by examiner

*Primary Examiner* — Hoa C Nguyen
*Assistant Examiner* — Binh Tran

(57) ABSTRACT

A shielding device is provided for protecting wires, cables and the like from rays, heat and the like, in a wire harness manufacturing assembly. The shielding device comprises at least one wire-covering member, such as a tube through which the wire extends. The tube is adapted to be displaced between a wire-revealing position and a wire-concealing position, wherein in the former position, the tube allows the wire to be exposed to the rays, whereas in the latter position, the tube is in a ray-exposure area and at least partly shields the wire from the rays. Typically there are two aligned tubes slidably displaceable towards and away from each other so as to respectively assume the wire-concealing and wire-revealing positions. A compressed air source, in fluid communication with an inside of the tubes, cools the wire when in the wire-concealing position.

10 Claims, 5 Drawing Sheets

SHIELDING DEVICE FOR WIRES LOCATED IN LIGHT-EMITTING APPARATUSES

CROSS-REFERENCE TO RELATED APPLICATIONS

This application claims priority from Canadian Application No. 2,690,763, which was filed on Jan. 21, 2010.

FIELD OF THE INVENTION

The present invention relates to wires and cables and, more particularly, to handling of wires in the process for instance of manufacturing a wiring harness provided with various electric circuitries.

BACKGROUND OF THE INVENTION

Electricity is used everywhere. Electric power and electric signals are required on plenty of today's products. Electricity powers motors and devices while electric signals are used to sense and control various components. It is therefore common to have both an electric power system and an electric signal system in a single apparatus.

Electric power and electric signals are generally transmitted with wires from a start position to a destination position. For instance, it could be from a power source to a light, or a fan, in the case of an electric power circuit. Conversely, in the case of electric signals, a wire can be routed from a computer board to a sensor to transmit data between the sensor and the computer board.

Many wires are commonly required on a product to route electric power and electric signals between various components. It is therefore good practice to group the wires together such that they follow a single path. It helps to protect the wires, to more easily retrieve a particular wire when assembled on the apparatus, to reduce electromagnetic fields and to define the space required to allow passage of the wires. This group of wires is called a wiring harness.

From the main portion of the harness extend secondary branches routed to connect their associated components. The wiring harness comprises electric wires, terminals fittings attached to the ends of the electric wires and other parts such as connectors, tubes, protectors, tapes, grommets, seals and the like.

As mentioned above, the wiring harness is composed of a plurality of wires. Each wire has a unique and specific purpose and needs to be identified, cut to a proper length and installed at the right position in the wiring harness. Prior to combining the wires in a harness, the insulating sheath that covers the wire is cleaned and then identification can be apposed on the wire's insulating sheath. The wire can then be exposed to UV light to dry the ink or the like previously apposed on the insulating sheath to identify the wire.

In the manufacturing of a wiring harness, the wires are typically displaced from individual wire rolls to the machine which assembles the wires together in a wiring harness. During this process, the displacement of the wires can also be stopped in order to allow various actions to be undertaken within the complete harness manufacturing process. The wires, when so becoming stationary, can be overexposed to the aforementioned UV light.

Therefore, there is a need for protecting wires, in some circumstances, during the handling thereof.

SUMMARY OF THE INVENTION

It is therefore an aim of the present invention to provide a novel device that offers some protection to wires exposed to UV light, or the like.

Therefore, in accordance in the present invention, there is provided a shielding device for protecting wires, cables and the like from rays, heat and the like, comprising at least one wire-covering member, wherein a wire extends through the wire-covering member, the wire-covering member being adapted to be displaced between a first, wire-revealing position and a second wire-concealing position, wherein in the wire-revealing position, the wire-covering member is adapted to allow the wire to be exposed to the rays, whereas in the wire-concealing position, the wire-covering member is adapted to at least partly shield the wire from exposure to the rays.

More specifically, the wire-covering member includes at least one tube.

Furthermore, there may be provided a pair of tubes, the two tubes being substantially aligned and being adapted to be displaced towards each other so as to assume the wire-concealing position, and to be displaced away from each other so as to assume the wire-revealing position.

Typically, the tube is adapted to be slidably displaced along the wire either towards a ray-exposure area into the wire-concealing position, or away from the ray-exposure area into the wire-revealing position.

More particularly, the tube comprises an inner tube and an outer tube, the outer tube being slidable in a fixed guide bushing. Preferably, the outer tube is made of a low-friction material such as a TEFLON™-like material, whereas the inner tube is made of stainless steel.

Advantageously, there is provided a fluid source that is in fluid communication with an inside of the tube such that a fluid dispensed by the fluid source cools the wire when in the wire-concealing position. For instance, the fluid includes compressed air. Furthermore, a cooling device can be provided upstream of the tube for cooling the fluid dispensed by the fluid source before the fluid is fed to the tube.

Moreover, a cylinder is provided for displacing the wire-covering member between the first and second positions.

Also in accordance in the present invention, there is provided a shielding device for protecting wires from heat, comprising at least one wire-covering member, the wire-covering member being adapted to be displaced between a first, wire-revealing position and a second wire-concealing position, wherein in the wire-revealing position, the wire-covering member is adapted to allow the wire to be exposed to heat, whereas in the wire-concealing position, the wire-covering member is adapted to at least partly shield the wire from the heat, wherein in the wire-concealing position the wire-covering member extends substantially completely around the wire.

Further in accordance in the present invention, there is provided a shielding device for protecting wires from heat, comprising at least one wire-covering member and a cooling medium, the wire-covering member being adapted to be displaced between a first, wire-revealing position and a second wire-concealing position, wherein in the wire-revealing position, the wire-covering member is adapted to allow the wire to be exposed to heat, whereas in the wire-concealing position, the wire-covering member is adapted to at least partly shield the wire from the heat, the cooling medium being adapted to act on the wire at least when the wire-covering member is in the wire-concealing position.

Typically, a cooling source is provided for dispensing the cooling medium, the cooling source being in fluid communication with an inside of the tube such that the cooling medium dispensed by the cooling source cools the wire when in the wire-concealing position. For instance, the cooling medium includes a fluid, such as compressed air. Also, a cooling device can be provided upstream of the tube for cooling the cooling medium dispensed by the cooling source before the cooling medium is fed to the tube.

Other objects, advantages and features of the present invention will become more apparent upon reading of the following non-restrictive description of embodiments thereof, given by way of example only.

The foregoing and other objects, advantages and features of the present invention will become more apparent upon reading of the following non-restrictive description of an illustrative embodiment thereof, given by way of example only, with reference to the accompanying drawings.

DESCRIPTION OF ILLUSTRATIVE EMBODIMENTS OF THE INVENTION

Figure 1:
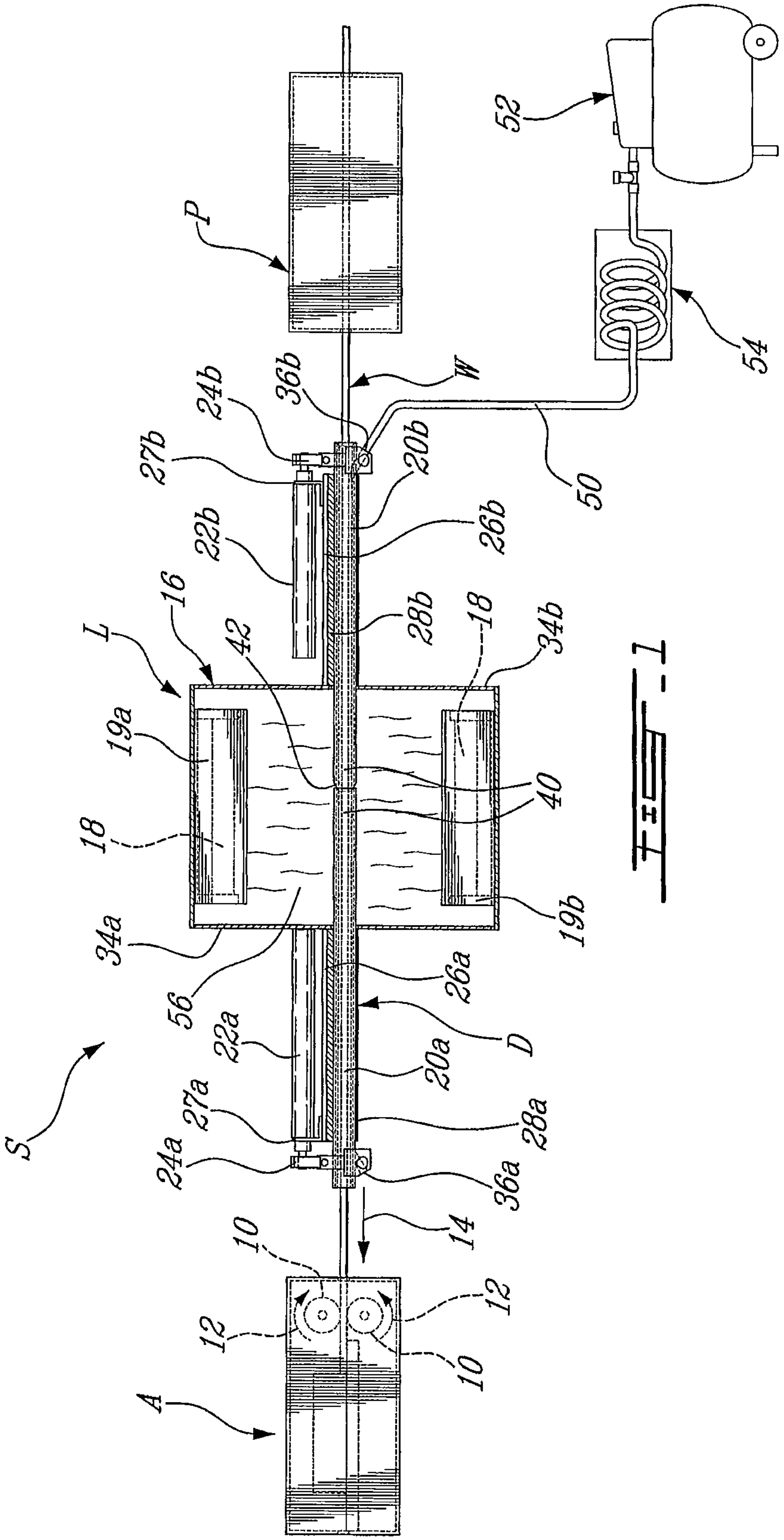
FIG. 1 is an elevation view of a wire being displaced through a series of apparatuses, including a UV light-emitting apparatus equipped with a wire shielding device in accordance with the present invention.

FIG. 1 illustrates a series of apparatuses S through which a wire W goes through, for instance in a wire harness manufacturing assembly. In the present description, the wire W is meant to include both the metallic core as well as its insulating outer sheath. The wire W is typically taken upstream from a roll (not shown), encounters a series of apparatuses, and is assembled downstream with other wires in a harness (not shown), wherein the end of the wire can be stripped of its insulating sheath, provided with seals, terminal fittings, etc.

FIG. 1 thus shows a few apparatuses S in such an assembly, that is a printing apparatus P, a light-emitting apparatus L, and a wire-drawing apparatus A. The printing apparatus P is adapted to print information, via printing heads thereof, on the wire W (i.e. on the insulating sheath thereof), such as to provide identification data on the wire W. Prior to the printing step, the wire W is typically cleaned. The light-emitting apparatus L is adapted to dry the identification data previously apposed on the wire W by the printing apparatus P.

The wire-drawing apparatus A is adapted to pull on the wire W so as to unwind the wire W from its upstream roll and convey the wire W through the manufacturing process and the various stations and apparatuses thereof. The wire W is herein shown as extending in a nip defined between a pair of motor-driven rollers 10 whose rotation along arrows 12 and whose frictional engagement with the wire W cause the latter to translationally displace through the wire-drawing apparatus A, as per arrow 14. Other arrangements can be used, such as a driving roller and a pinching roller.

The light-emitting apparatus L comprises a casing 16 and upper and lower UV lights 18 directed towards the wire W extending through the light-emitting apparatus L. The light-emitting apparatus L also includes upper and lower reflective panels 19*a* and 19*b* to concentrate the light emitted by the UV lights 18 on the section of the wire W located within the casing 16. The light-emitting apparatus L is herein provided with a wire-shielding device D, hereinafter generally referred to as the shielding device D. The light-emitting apparatus L and the shielding device D are shown in isolation in FIGS. 2 to 5.

During the manufacturing process of the wire harness, the displacement of the wire W is sometimes interrupted so that a station or apparatus can act thereon. For instance, when information is printed on the wire W by the printing apparatus P, the wire is temporarily stopped. Also, in the downstream station where various wires W are assembled together to produce a harness, there may be required a substantially lengthy stoppage of the displacement of the wire W to permit the various wires in the downstream station to be acted thereon, such as being fitted with seals, terminals, etc.

During such a stoppage, the portion of the wire W which is located in the shielding device D may be overexposed to the UV lights 18. Indeed, there is a significant amount of heat present in the casing 16 of the light-emitting apparatus L, whereby the wire W immobilized therein may be subjected to too much heat thereby causing the insulating sheath of the wire W to soften. As the wire W is then drawn through the assembly stations, for instance via the action of the rollers 12 of the wire-drawing apparatus A, the so-softened insulating sheath of the wire W can become deformed to an unacceptable level, for instance as it passes between such rollers. The shielding device D is adapted to prevent such unacceptable deformation of the insulating sheath of the wire W, as follows.

Figure 2:
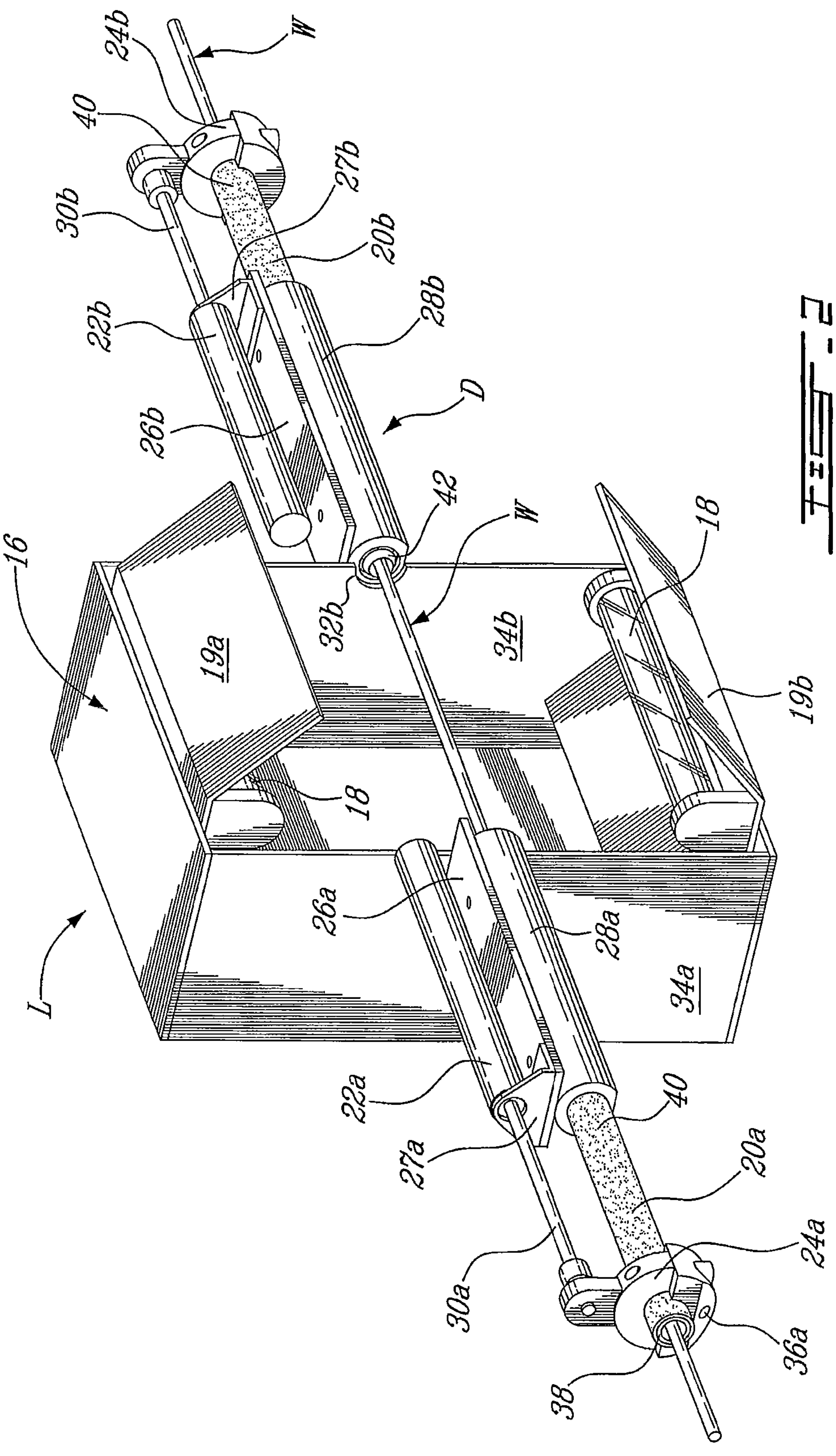
FIG. 2 is a perspective view of the UV light-emitting apparatus and the wire shielding device, showing the shielding device in an extended, wire revealing, position thereof.
Figure 3:
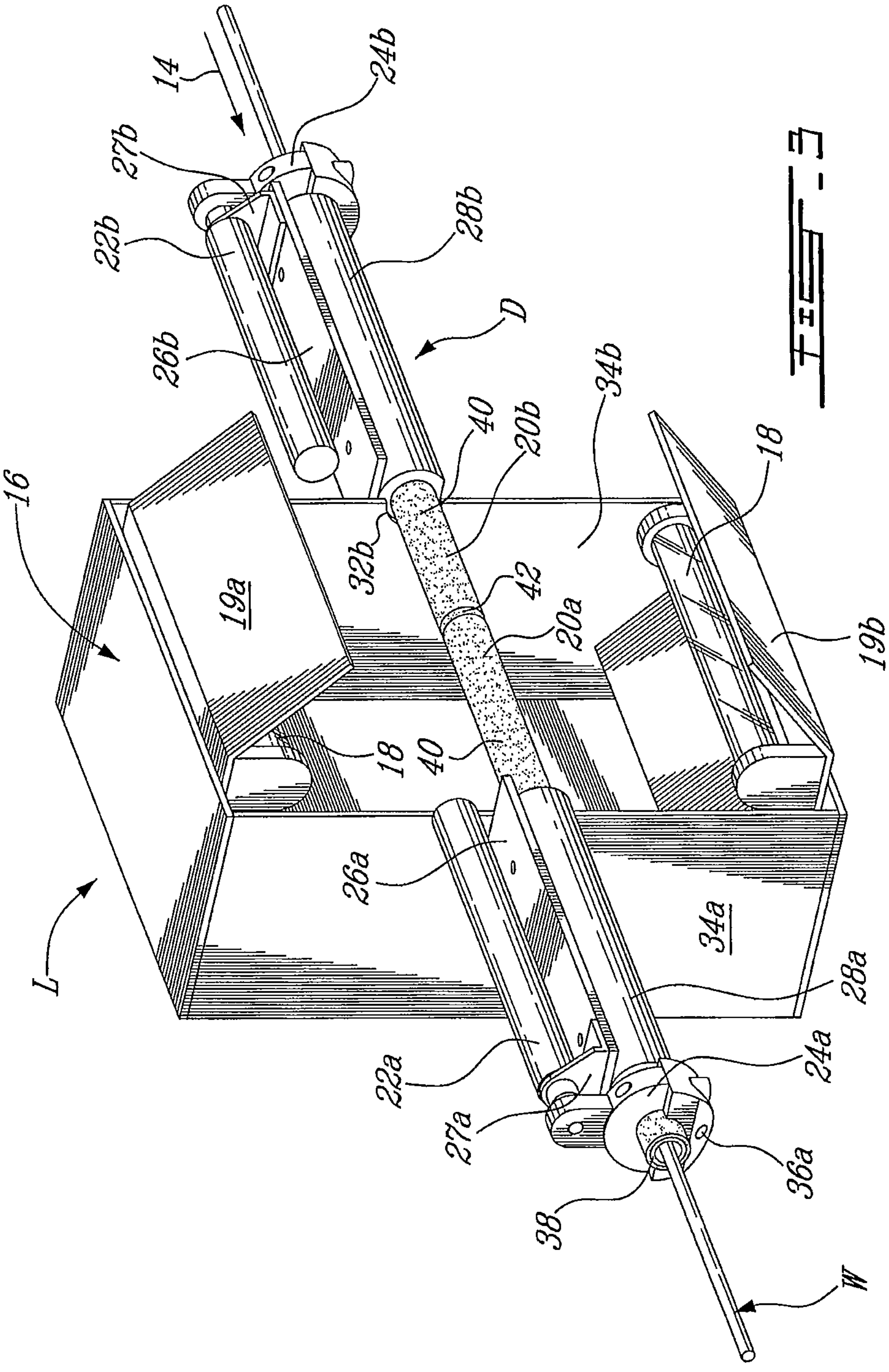
FIG. 3 is a perspective view of the UV light-emitting apparatus and the wire shielding device, showing the shielding device in a retracted, wire covering, position thereof.

As best seen in FIGS. 2 and 3, the shielding device D basically comprises a pair of shielding tubes 20*a* and 20*b* through which the wire W extends, a pair of pneumatic cylinders 22*a* and 22*b*, and a pair of collars 24*a* and 24*b*. The cylinders 22*a* and 22*b* are mounted on flanges 27*a* and 27*b* of a pair of fixed support plates 26*a* and 26*b* located respectively downstream and upstream of the casing 16 of the light-emitting apparatus L. A pair of elongated bushings 28*a* and 28*b* are fixedly mounted to the underside of the support plates 26*a* and 26*b*, respectively, with the shielding tubes 20*a* and 20*b* being slidably engaged in respective elongated bushings 28*a* and 28*b*.

The cylinders 22*a* and 22*b* include respective pistons 30*a* and 30*b*, and the pistons 30*a* and 30*b* are mounted at distal ends thereof to the collars 24*a* and 24*b*, respectively. The collars 24*a* and 24*b* are fixedly secured around outer ends of the shielding tubes 20*a* and 20*b*, respectively. Openings 32*a* and 32*b* are respectively defined in downstream and upstream vertical walls 34*a* and 34*b* of the casing 16. The openings 32*a* and 32*b* are positioned and sized so as to allow respective shielding tubes 20*a* and 20*b* to slide in and out of the casing 16 under operation of the cylinders 22*a* and 22*b*, as will be explained in details hereinafter.

Figure 4:
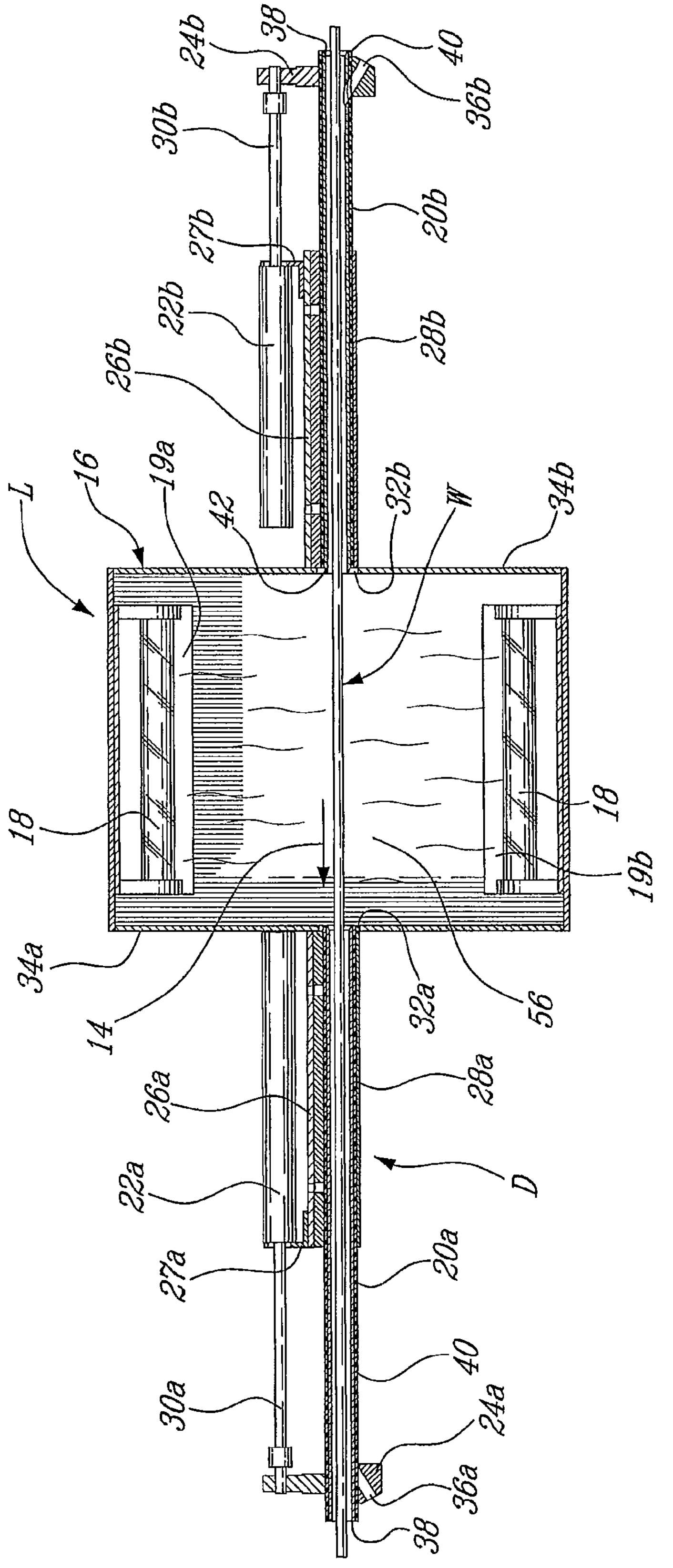
FIG. 4 is vertical cross-sectional view of the UV light-emitting apparatus and the wire shielding device of FIG. 2, showing the shielding device in an extended, wire revealing, position thereof.
Figure 5:
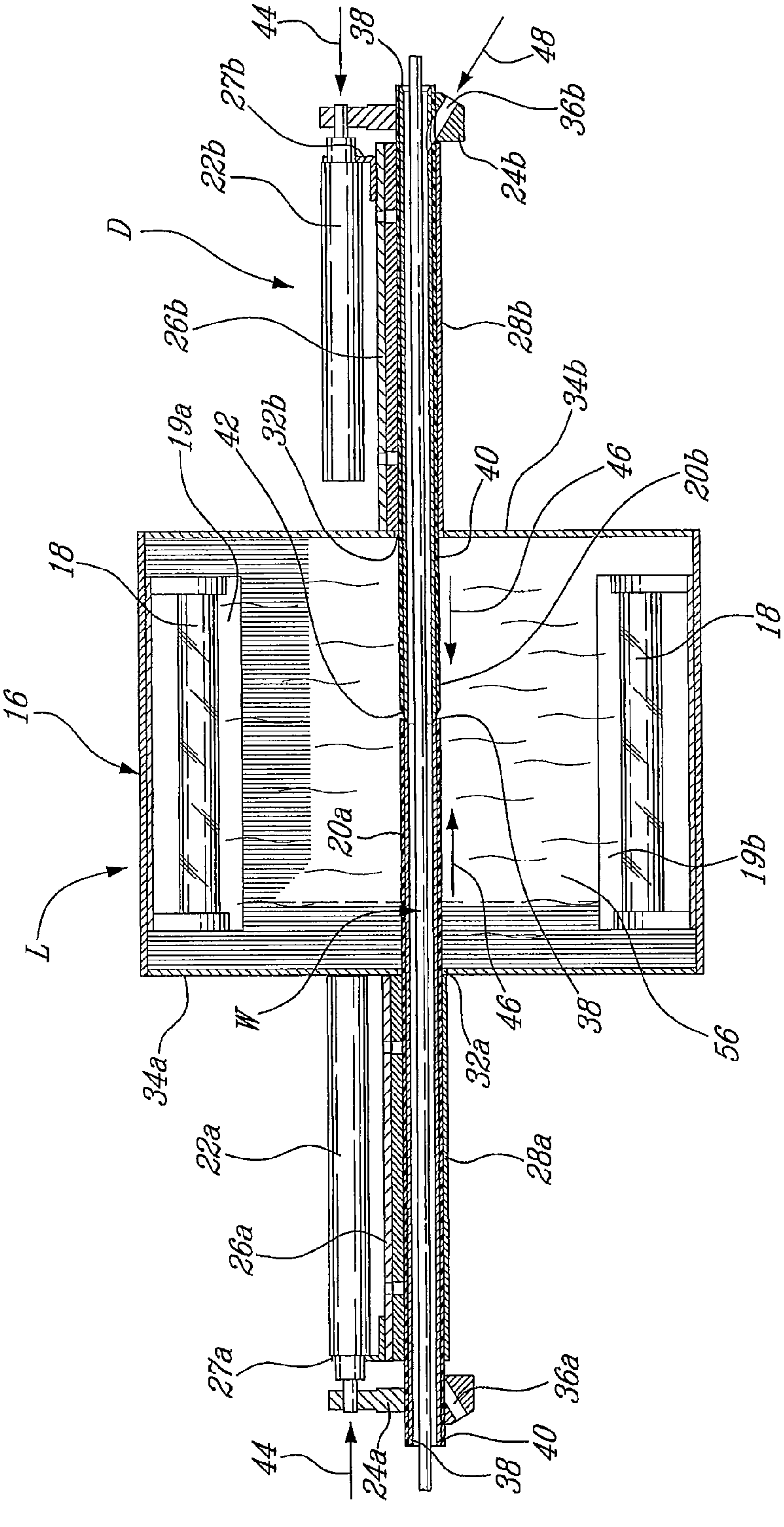
FIG. 5 is vertical cross-sectional view of the UV light-emitting apparatus and the wire shielding device of FIG. 3, showing the shielding device in a retracted, wire covering, position thereof.

As best seen in FIGS. 4 and 5, air inlets 36*a* and 36*b* are defined in the collars 24*a* and 24*b*, respectively. In the present embodiment, only the air inlet 36*b* is used, being connected via a hose 50 to a cooling source, such as a compressed air supply 52 (see FIG. 1), with the air inlet 36*b* being in fluid communication with the inside of the shielding tube 20*b*, via a hole (not shown) defined through the shielding tube 20*b* and opposite the downstream end of the air inlet 36*b*, such that air fed through the hose and into the air inlet 36*b* is conveyed inside the shielding tube 20*b*.

Other cooling media, including fluids other than air, can be used to cool the wire W within the shielding tubes 20*a* and 20*b* (when in their retracted, wire covering, position shown in FIGS. 3 and 5). Also, the cooling fluid can itself be cooled upstream of the air inlet 36*b*, via a cooling device 54 (see FIG. 1), e.g. a cooling coil or the like, such as to provide further cooling to the wire W than that provided, for instance, by compressed ambient air.

The collars 24*a* and 24*b*, support plates 26*a* and 26*b* (including the flanges 27*a* and 27*b* thereof) and the bushings 28*a* and 28*b* can be made of steel. The shielding tubes 20*a* and 20*b* are each made of an inner tube 38 made of stainless steel and an outer tube 40 made of polytetrafluoroethylene (PTFE), such as TEFLON™. The inner end 42 of the shielding tube 20*b* is tapered, as best shown in FIGS. 2 and 5.

On the operation side, the shielding device D is adapted to protect the portion of the wire W located in the light-emitting apparatus L from overexposure to the UV rays emitted by the UV lights 18, when the wire W is immobilized, for instance as it is being acted upon in a given station or apparatus of the manufacturing process. More particularly, when the wire W displaces through the light-emitting apparatus L or when it needs to be exposed for a given period of time so that the UV rays can act on the information printed on the outer insulation sheath of the wire W, the shielding tubes 20*a* and 20*b* are in an extended, wire-revealing, position thereof as illustrated in FIGS. 2 and 4. In this position, the shielding tubes 20*a* and 20*b* are located outside of the casing 16 of the light-emitting apparatus L thereby selectively exposing the wire W to the UV lights 18. The cylinders 22*a* and 22*b* have their pistons 30*a* and 30*b* in an extended position.

With reference to FIG. 5, when the wire W is immobilized in a ray-exposure area 56 of the light-emitting apparatus L and overexposure thereof to the UV light is likely and needs to be prevented, the cylinders 22*a* and 22*b* retract the pistons 30*a* and 30*b*, as per arrows 44, to a retracted position, as shown in FIGS. 3 and 5. This action can result from a signal to the cylinders 22*a* and 22*b*, which has emanated for instance along with a stoppage of the rotation of the driving rollers 10, noting that a time delay can be provided, which corresponds to a selected period of time during which the immobilized wire W can be subjected to the UV light without undue damage to the sheath thereof.

The retraction of the pistons 30*a* and 30*b* causes the collars 24*a* and 24*b* to displace towards the casing 16 of the light-emitting apparatus L, again along arrows 44. The translational movement of the collars 24*a* and 24*b* draws the shielding tubes 20*a* and 20*b* inwardly towards the casing 16, the shielding tubes 20*a* and 20*b* being guided and supported by the elongated bushings 28*a* and 28*b*. The shielding tubes 20*a* and 20*b* are thus displaced translationally along arrows 46 towards one another. Once in their fully retracted, wire concealing, position, the inner ends of the shielding tubes 20*a* and 20*b* typically abut each other, as illustrated in FIGS. 3 and 5, with the tapered end 42 of the shielding tube 20*b* being at least partly lodged in the facing inner end of the shielding tube 20*a*. The inner end of the shielding tube 20*a* is typically flared for a better mating of the two shielding tubes 20*a* and 20*b*.

In this retracted, wire concealing, position, the shielding tubes 20*a* and 20*b* cover the portion of the wire W located in the light-emitting apparatus L thereby preventing it from overexposure to the UV rays emitted by the UV lights 18 and avoiding softening or degradation of the insulating sheath of the wire W. Air fed through the hose and into the air inlet 36*b* along arrow 48 (FIG. 5) ends up within the shielding tubes 20*a* and 20*b*, in the retracted, wire covering, position thereof shown in FIGS. 3 and 5, for cooling the wire W located therein.

Once the wire W starts to move again through the light-emitting apparatus L, the shielding tubes 20*a* and 20*b* are moved to their extended, wire revealing, position of FIGS. 2 and 4, which allows the wire W to be exposed to the UV lights 18.

Two shielding tubes 20*a* and 20*b* have herein been provided for covering the portion of the wire W located in the light-emitting apparatus L. However, there could be a single longer shielding tube, although its travel between the retracted, wire concealing, position and the extended, wire revealing, position would be basically doubled.

With the provision of the two shielding tubes 20*a* and 20*b*, the shielding device D has two cylinders 22*a* and 22*b* (activated by pneumatic valves, not shown), which have a shorter stroke (than a single cylinder operating a single shielding tube would have) and thus provide a quicker transition between the extended wire-revealing and the retracted wire covering positions.

Obviously, the present shielding device D can be used in applications other than on an assembly for manufacturing a wire harness from a series of individual wires and other components (e.g. terminals fittings, connectors, tubes, protectors, tapes, grommets, seals and the like). Indeed, the shielding device D can be used to protect all sorts of wires and like from deformation when subjected to heat and the like.

Although the present invention has been described hereinabove by way of illustrative embodiments thereof, it may be modified, without departing from the nature and teachings of the subject invention as described herein.

The invention claimed is:

1. A system for processing electrical sheathed wires comprising:

- a printing apparatus for printing information on electrical sheathed wires; and
- an UV-light emitting apparatus comprising:
  - upper and lower UV lights for emitting UV rays to dry the information printed on the electrical sheathed wires; and
  - a shielding device for protecting the electrical sheathed wires from the UV rays emitted by the UV lights, comprising at least one wire-covering member, wherein an electrical sheathed wire extends through the wire-covering member, the wire-covering member being adapted to be displaced between a first, wire-revealing position and a second wire-concealing position, wherein in the wire-revealing position, the wire-covering member is adapted to allow the electrical sheathed wire to be exposed to the UV rays, whereas in the wire-concealing position, the wire-covering member is adapted to at least partly shield the electrical sheathed wire from exposure to the UV rays, and wherein there is provided a fluid source in fluid communication with an inside of the wire-covering member such that a fluid dispensed by the fluid source cools the electrical sheathed wire at least when the wire-covering member is in the wire-concealing position.

2. A system according to claim 1, wherein the wire-covering member includes at least one tube.

3. A system according to claim 2, wherein there are provided a pair of tubes, the two tubes being substantially aligned and being adapted to be displaced towards each other so as to assume the wire-concealing position, and to be displaced away from each other so as to assume the wire-revealing position.

4. A system according to claim 2, wherein the tube is adapted to be slidably displaced along the electrical sheathed wire either towards a ray-exposure area into the wire-concealing position, or away from the ray-exposure area into the wire-revealing position.

5. A system according to claim 2, wherein the tube comprises an inner tube and an outer tube, the outer tube being slidable in a fixed guide bushing.

6. A system according to claim 5, wherein the outer tube is made of a low-friction material.

7. A system according to claim 6, wherein the inner tube is made of stainless steel and the outer tube is made of a low-friction material; the low-friction material comprising polytetrafluoroethylene.

8. A system according to claim 1, wherein the fluid includes compressed air.

9. A system according to claim 1, wherein a cooling device is provided upstream of the tube for cooling the fluid dispensed by the fluid source before the fluid is fed to the tube.

10. A system according to claim 1, wherein a cylinder is provided for displacing the wire-covering member between the first and second positions.

* * * * *